(12) United States Patent
Heintze (10) Patent No.: US 7,057,705 B2
(45) Date of Patent: Jun. 6, 2006

(54) LITHOGRAPHIC APPARATUS, DEVICE MANUFACTURING METHOD, PERFORMANCE MEASURING METHOD, CALIBRATION METHOD AND COMPUTER PROGRAM

(75) Inventor: Johannes Heintze, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 166 days.

(21) Appl. No.: 10/431,583

(22) Filed: May 8, 2003

(65) Prior Publication Data

US 2004/0021840 A1      Feb. 5, 2004

(30) Foreign Application Priority Data

May 10, 2002     (EP) .................................. 02253303

(51) Int. Cl.
*G03D 27/42*     (2006.01)

(52) U.S. Cl. ............................ 355/53; 355/67; 355/69; 250/492.2; 362/5; 362/18

(58) Field of Classification Search ..................... None
See application file for complete search history.

(56) References Cited

U.S. PATENT DOCUMENTS 5,982,790 A     11/1999 Grossman et al. ............. 372/25

FOREIGN PATENT DOCUMENTS

| JP | 2001-244531 | 9/2001 |
|---|---|---|
| WO | WO 01/28048 A2 | 4/2001 |
| WO | WO 01/28048 A3 | 4/2001 |

*Primary Examiner*—D. Rutledge
(74) *Attorney, Agent, or Firm*—Pillsbury Winthrop Shaw Pittman, LLP (57) ABSTRACT

A controller for a pulsed radiation source is a closed-loop controller of minimum order, preferably first, to effect dead beat control. Performance indicators for a pulsed radiation source in a lithographic apparatus are based on moving averages (MA) and moving standard deviations (MSD) of the error between target and actual pulse energies. The normalized indicators are given by:

$$MA_{E,n}(x_k) = \frac{1}{\sum_{i=k-(N_{slit-e}-1)}^{k} Ep_{ref}(i)} \cdot \sum_{i=k-(N_{slit-e}-1)}^{k} Ep_{err}(i) \quad (k = N_{slit-e} \ldots N_{scan}),$$

wherein $Ep_{ref}(i)$ and $Ep_{err}(i)$ indicate reference energy per pulse and energy error per pulse for point i and $$MSD_{E,n}(x_k) = \sqrt{\frac{1}{N_{slit-e}-1} \sum_{i=k-(N_{slit-e}-1)}^{k} \left[\frac{Ep_{err}(i)}{Ep_{ref}(i)} - MA_{E,n}(x_k)\right]^2}$$

$(k = N_{slit-e} \ldots N_{scan}).$

16 Claims, 7 Drawing Sheets

LITHOGRAPHIC APPARATUS, DEVICE MANUFACTURING METHOD, PERFORMANCE MEASURING METHOD, CALIBRATION METHOD AND COMPUTER PROGRAM

RELATED APPLICATION

This application claims the benefit of priority to European Patent Application No. 02253303.8, filed May 10, 2002, the contents of which are herein incorporated by reference.

BACKGROUND OF THE INVENTION

1. Field of the Invention

The present invention relates to a lithographic projection apparatus, a device manufacturing method, a performance measuring method, a calibration method and a computer program.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

Some current lithographic apparatus use excimer lasers as the source for the exposure radiation. These lasers are pulsed and a large number of pulses (called a shot or burst) is used to make up a single exposure. The dose delivered to the substrate in an exposure is the sum of the energy delivered in each pulse so that the dose may be controlled by monitoring the energy of each pulse and altering the energy of a subsequent pulse to compensate for any deviation from the nominal pulse energy. Such control may be effected by varying the voltage applied to excite the lasing medium in the laser cavity, also referred to hereinafter as excitation voltage or high voltage HV. Another means for such control is a variable attenuator positioned in the beam path in the radiation system of the lithographic apparatus. This approach has so far provided adequate performance but to meet demands for improved performance of the lithographic apparatus it is necessary to control the dose to tighter specifications, even when the number of pulses per exposure is reduced, reducing the opportunity to correct dose errors.

Excimer lasers used at present are complex devices and exhibit complex behavior under control. In particular, step changes in operating parameters, e.g. when the laser is turned on at the beginning of an exposure or series of exposures or when there is a change in pulse repetition rate or excitation voltage, result in large transient oscillations of the pulse energy. To avoid variations in the dose delivered at substrate level, the control system for the laser must take account of such transients and other complex behaviors of the laser, resulting in a necessarily complex control system. A key part of the control system is the gain which models the transfer function between the high voltage applied to the laser cavity and the output pulse energy Ep.

Fine tuning the parameters of the laser control system is difficult and it is particularly difficult to take account of time varying effects, e.g. gas aging in the laser cavity. One method of fine tuning the control parameters is to make test runs using a specific reference profile for the energy per pulse. However, such measurements cannot be made during exposures and so the time taken for them reduces machine throughput. It has been proposed in WO 99/08156 to tune the control parameters during an exposure by adding a small disturbance to the pulse energy set point, temporarily suspending control, and observe the effect in the measured output. However, to meet dose uniformity requirements, the disturbance must be kept very small. Therefore it takes a long time, many exposures, to gather the necessary information in order to calibrate the pulse-energy/high-voltage gain. The latter calibration will be referred to hereinafter as the HV-Ep calibration.

SUMMARY OF THE INVENTION

It is an aspect of the present invention to provide a lithographic apparatus capable of more accurate dose control. It is a further aspect of the invention to provide methods of measuring the performance of a pulsed radiation source in a lithographic apparatus and methods of calibrating the control system of the radiation source, even during exposures.

These aspects achieved according to the invention in a lithographic projection apparatus including a radiation system constructed and arranged to provide a beam of radiation, including the pulsed radiation source; a support constructed and arranged to support a patterning device, the patterning device constructed and arranged to pattern the beam of radiation according to a desired pattern; a substrate table constructed and arranged to hold a substrate; a projection system constructed and arranged to project the patterned of radiation beam onto a target portion of the substrate, and a control system constructed and arranged to control the energy pulses of the beam of radiation, wherein the control system comprises a closed-loop controller of minimum order.

By using a closed-loop controller of minimum order, the present invention provides a dead beat controlled discrete time system (i.e. a critically damped system with no overrun or oscillation in changing from state to state). The inventor has determined that despite the apparent complexity of the pulsed radiation sources and their behavior, the structural dynamics of the source can be modeled by a first order model, preferably by a first order time delay which equals $z^{-1}$ in the z-domain where z is a complex variable. Structural dynamics of the source do not include parasitic and transient effects. The control system can therefore be implemented as a simple integrator, e.g. a backward Euler discrete time approximation $Tz/(z-1)$ where T denotes the duration of each discrete time interval, and appropriate control parameters adjusted to effect dead beat control or a close approximation thereof. In addition, the inventor has determined that the validity of the first order model is independent of the pulse repetition rate, also referred to hereinafter simply as the repetition rate, at which the source is operated. This allows repetition rate independent control design, parasitic and transient effects disregarded. Consequently, the duration of a discrete time step T can be omitted in the backward Euler approximation, resulting in a control system that is a summator $z/(z-1)$ rather than an integrator. This has the advantage that, independent of the repetition rate, a constant control gain can be used to effect dead beat control, provided that a correct HV-Ep calibration has been carried out. Although parasitic effects such as resonance frequencies of the laser are not specifically included, the described controller has the advantage over current controllers that it is more robust against these parasitic effects and also against incorrect HV-Ep calibrations.

A feed-forward loop can be provided to predictively correct transient effects. A design of a repetition rate independent controller that learns the transient effects which should be corrected, can be based on a minimum order model. For example, the learning mechanism for feed-forward correction structurally employs the first order time delay model in combination with summator control such that dead beat behavior is effectuated. The control system may deviate from perfect dead beat control because of so-called parasitic effects (parasitic dynamics) or to provide robustness, i.e. control design that provides a reliable system even when some system properties vary or are unknown.

The second aspect of the invention is met by a method of measuring the performance of a pulsed radiation source and/or a lithographic projection apparatus, the lithographic projection apparatus including a radiation system constructed and arranged to provide a beam of radiation, including the pulsed radiation source; a support constructed and arranged to support a patterning device, the patterning device constructed and arranged to pattern the beam of radiation according to a desired pattern; a substrate table constructed and arranged to hold a substrate; a projection system constructed and arranged to project the patterned beam onto a target portion of the substrate, the method including measuring, for a plurality of consecutive pulses of radiation, the values of at least one of: the pulse energy and a control input applied to the radiation source; and calculating from the measured values a plurality of values of at least one of: a moving average (MA) error between the measured value and a target value and a moving standard deviation (MSD) of the error between the measured value and a target value, wherein the calculated values indicate the performance of the radiation source and/or the lithographic projection apparatus.

This method is able to distinguish between apparatus that, although passing conventional performance tests based on the total dose delivered at substrate level, are close to the edge of stability and those which are more stable. Large variations in the MA values and large magnitudes in the MSD values indicate a relatively unstable control system. As well as full data from a test run, peak values of the indicators may be used as performance measures. The method can be used both online and offline and even while the control set point is varying.

Preferably, especially for comparative purposes, the performance indicators are normalized.

A third aspect of the present invention uses the above described performance indicators to provide a method of calibrating the control system of a pulsed radiation source in a lithographic apparatus as described above with respect to the second aspect of the present invention, the method including measuring the performance of the radiation source and the control system according to the method described above; adjusting at least one parameter of the control system; and repeating the measuring and adjusting to reduce at least one of the calculated moving average and moving standard deviation values.

This method is advantageously applied using performance indicators measured during actual exposure processes and thereby provides an on-the-fly calibration of the control system capable of taking account of source ageing and other phenomena that may take effect in a shorter timescale than off-line calibrations can be carried out.

Alternatively, according to a further aspect of the invention there is provided a method of calibrating a control system of a pulsed radiation source in a lithographic apparatus comprising a control system with a closed loop controller of first order whereby at least one parameter of the control system associated with the radiation source is adjusted. In general, a plurality of parameters associated with the radiation source can be adjusted, but the present invention discloses a simple method of calibrating the specific transfer function between the high voltage applied to the laser cavity and the pulse energy. This transfer function is linearized using a pulse-energy/high-voltage gain and accompanying offset, which are measured in the HV-Ep calibration. The method of HV-Ep calibration relies on the first order time delay model of the source in combination with control design of minimum order.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 248, 193, 157 or 126 nm) and EUV (extreme ultra-violet radiation, e.g. having a wavelength in the range 5–20 nm.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
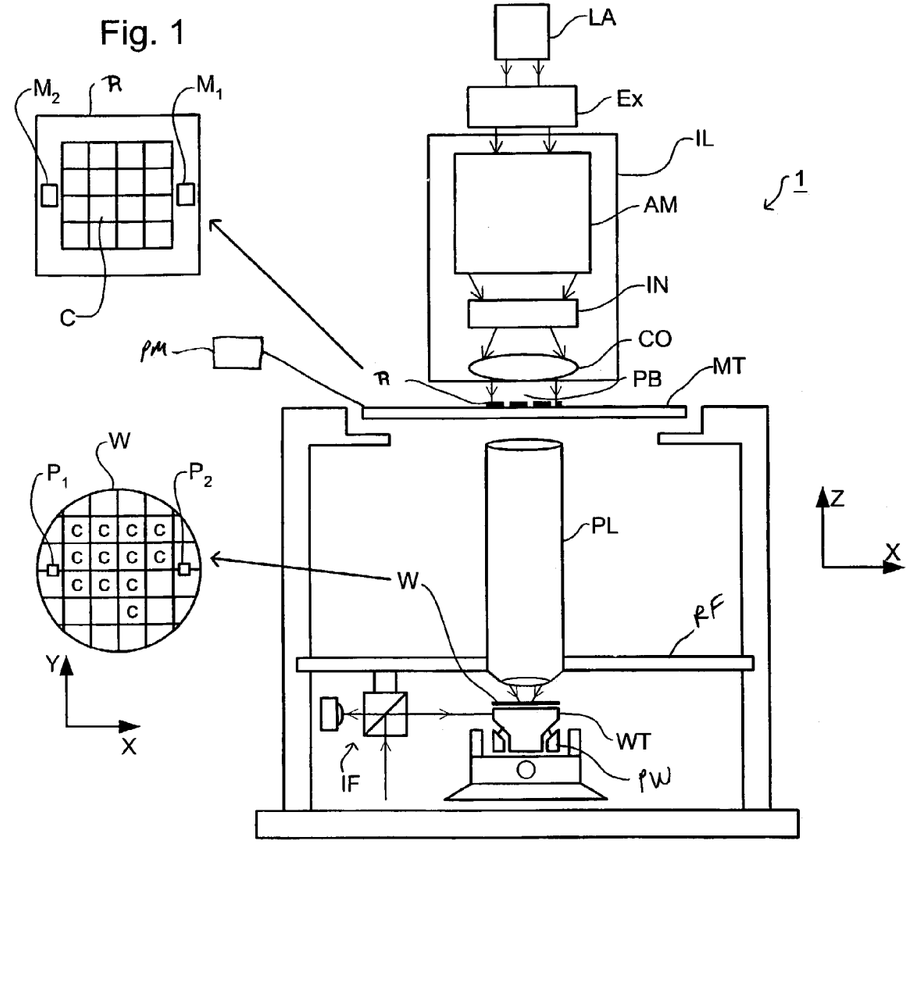
FIG. 1 depicts a lithographic projection apparatus according to a first embodiment of the invention.

FIG. 1 schematically depicts a lithographic projection apparatus 1 according to an embodiment of the invention. The apparatus includes a radiation system Ex, IL constructed and arranged to supply a beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask R (e.g. a reticle), and connected to a first positioning device PM to accurately position the mask R with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask R onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask R has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a projection beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask R with respect to the path of the beam PB, e.g. after mechanical retrieval of the mask R from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask R and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g. the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
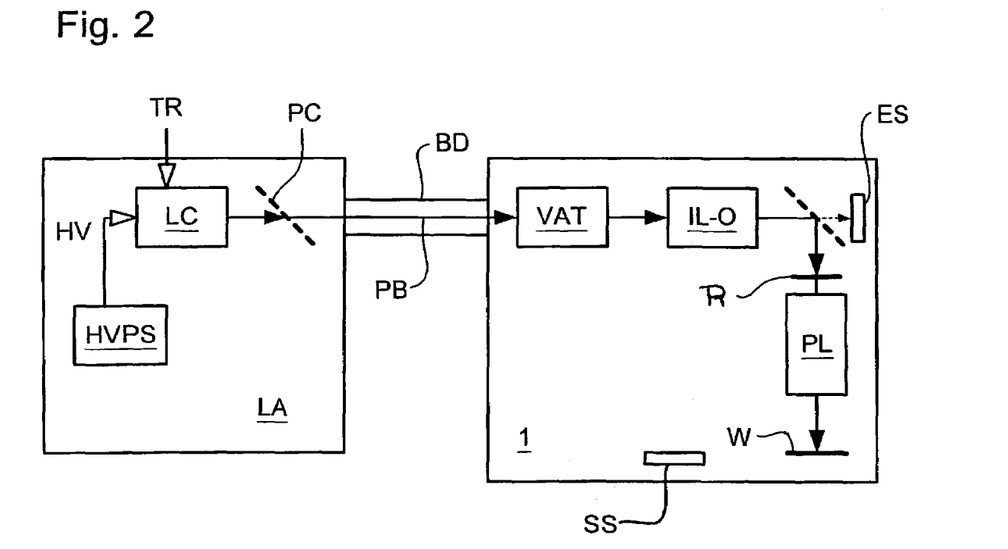
FIG. 2 depicts the radiation source and certain other components of the apparatus of FIG. 1.

FIG. 2 illustrates certain components of the radiation source LA and lithographic apparatus 1 useful to explain the control of the dose delivered to the substrate during an exposure. The radiation source LA comprises a laser cavity LC containing a lasing medium, e.g. KrF, which is excited by a high voltage HV provided by high voltage power supply HVPS. On application of a trigger TR, the laser cavity LC emits a pulse of coherent radiation. The energy of this is measured by a photocell PC. For various reasons, the radiation source LA may be located outside the cleanroom in which the lithography apparatus 1 is kept and so the beam PB is conducted to the lithography apparatus 1 by beam delivery pipe BD, which may comprise a gas purged pipe and mirrors to direct beam PB around any corners.

In the lithography apparatus 1, the beam PB traverses a variable attenuator VAT, other optical components of the illumination system IL-O, such as the adjusting device AM, integrator IN and condenser CO, to illuminate the mask R. An image of the mask pattern is then projected onto the target portion of the substrate W by the projection system PL. An energy sensor ES is positioned behind a partially silvered mirror positioned as far as possible downstream along the direction of propagation of the beam PB in the illumination system IL and measures the energy of a predetermined fraction, e.g. 1%, of the projection beam. A spot sensor SS may also be provided on the wafer table WT and used for off-line calibration of the device but cannot provide a measurement of pulse energy during an exposure.

In the lithographic apparatus 1, the radiation source is set to provide pulses of a constant energy and uses feedback control based on the pulse energy as measured by photocell PC to regulate the high voltage HV applied to laser cavity LC. Control of the dose delivered to the substrate is based on the beam intensity as measured by the energy sensor ES and effected using the variable attenuator VAT. Each exposure is built up from a large number of pulses, e.g. 50 or more, and the desired total dose for an exposure is divided by the number of pulses to give a target energy for each pulse. The variable attenuator is used, with predetermined settings, to effect large intensity variations. It will be appreciated that for a scanning exposure the total dose must be correct over the width of the illumination slit in the scanning direction so that the dose must be correct within a number of pulses that depends on, amongst other things, the pulse repetition rate, the scanning speed and the width of the illumination slit.

Figure 3:
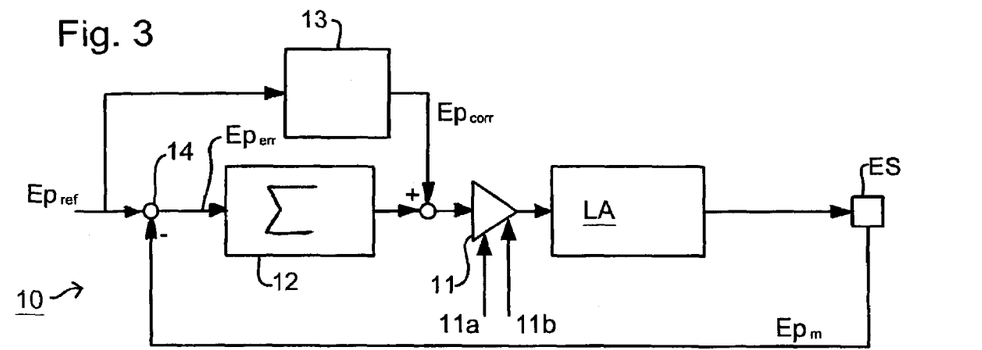
FIG. 3 depicts a control system for the radiation source of the apparatus of FIG. 1.

FIG. 3 depicts the integrated control system 10 of the first embodiment of the present invention. In this system the variable attenuator VAT is set to a fixed degree of attenuation and is omitted from the drawing for clarity. The control system 10 has as input a desired pulse energy $Ep_{ref}$, acting as a pulse energy set point. From this subtractor 14 subtracts the pulse energy $Ep_m$, of the previous pulse as measured by energy sensor ES to give the pulse energy error $Ep_{err}$, and supplies its output to a simple summator 12. An amplifier 11 applies a gain and offset to the summated pulse energy error $Ep_{err}$, representing the HV-Ep transfer function. The output of amplifier 11 determines the high voltage applied to the laser LA and hence the output pulse energy. The summator 12 may be implemented as a backward Euler discrete time approximation of an integrator $Tz/(z-1)$, with a normalized gain of $1/T$ (due to the repetition rate independence of the radiation source model). The above described components form a basic feedback loop forming the main part of the control system 10. The amplifier 11 has as parameters gain and offset values which are updated via inputs 11a, 11b in a manner to be described below.

The present inventor has determined that the structural dynamics of the laser, excluding parasitic and transient effects, act as a simple first order discrete time system, i.e. the pulse energy depends only on the last high voltage value previously commanded to the laser, and its transfer function is given by $z^{-1}$ only. The feedback loop of control system 10 is therefore of minimum order enabling dead beat control to be established by appropriate adjustment of the gain value of amplifier 11. The gain value to achieve dead beat control may be determined using the MA and MSD performance measures or using off-line or on-line HV-Ep calibration schemes as described below.

In addition to the feedback loop described above, the control system 10 has a feed-forward correction $Ep_{corr}$ determined by predictor 13. As shown in FIG. 3 the feed forward correction $Ep_{corr}$ is expressed in terms of pulse energy and added prior to amplifier 11. Alternatively, the feed forward correction can be calculated in terms of a high voltage correction and added after amplifier 11. In a simple implementation, the feed forward correction may represent a first order estimation of the initial high voltage HV to be applied to the laser cavity LC. An option to reduce a possible negative impact due to the use of such a simple implementation of the feed forward correction is to "dump" the first pulses to a closed shutter or masking blades in the illumination system IL. The feed forward correction $Ep_{corr}$ as introduced above may also correct for transient effects, to be discussed below.

Figure 4:
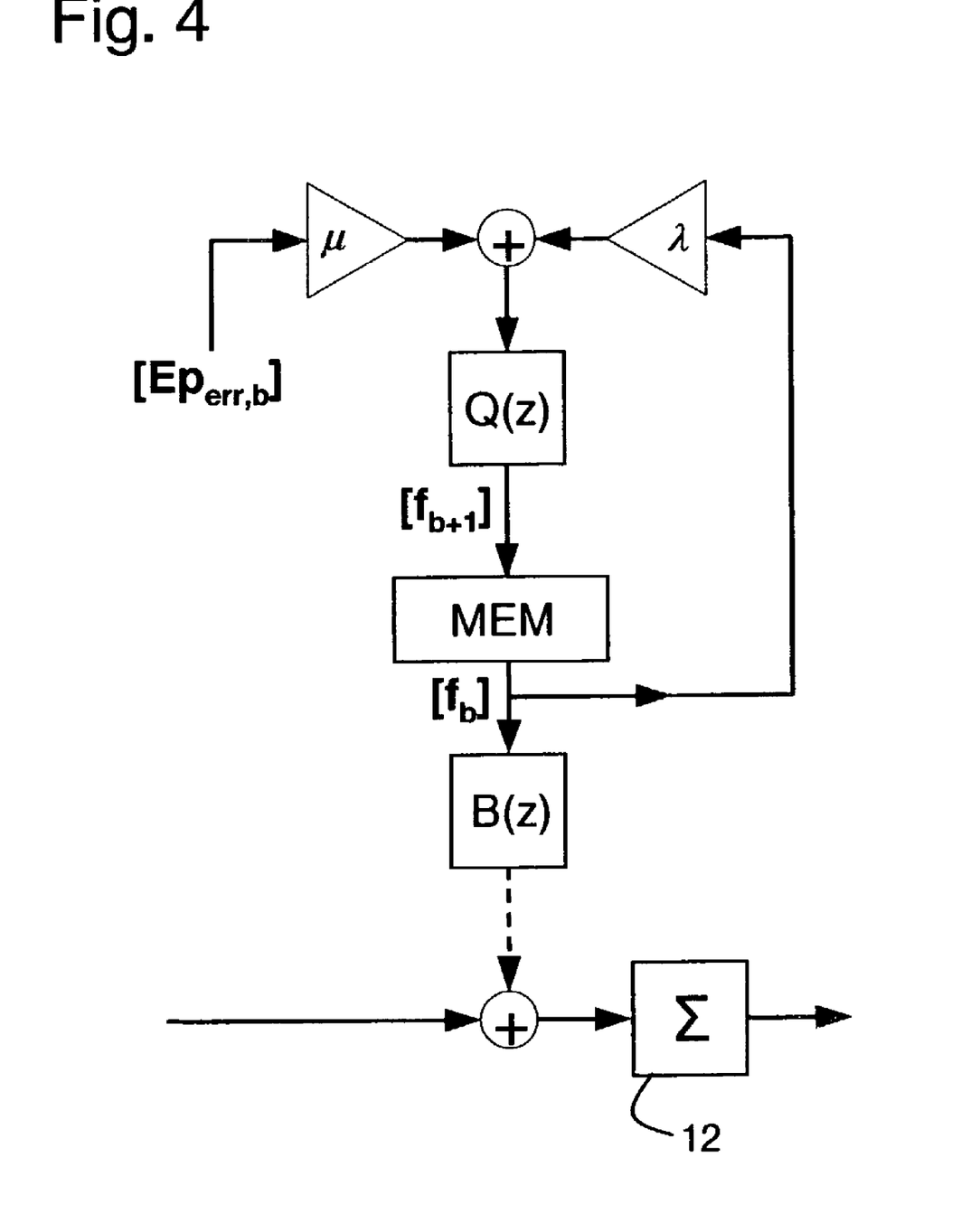
FIG. 4 depicts a feed forward controller to be added to the control system of FIG. 3.

The transient behavior of current radiation sources varies e.g. with time and/or with a change in the operational parameters of the radiation source. Another embodiment of the invention, depicted in FIG. 4, is a feed forward controller that automatically learns the transient behavior that should predictively be corrected for. In servo control theory, several control methods exist, such as repetitive, adaptive, iterative, and learning, which may also form combinations. For this controller the theory of iterative learning control (ILC) is made applicable for a laser, explicitly using the repetition rate independent minimum order model and control design. The advantage of using this theory is that controller design becomes less empirical but based on earlier used and known control methods.

The learning algorithm is fed with the pulse energy error vector $[Ep_{err,b}]$, which contains a time series of $Ep_{err}=(Ep_{ref}-Ep_m)$ of at least a part of a complete burst, where b indicates the burst number and [x] is a notation for a vector x. On the basis of this error vector a correction term $[f_{b+1}]$ is learned and stored in a memory MEM, according to the following update rule:

$$[f_{b+1}]=Q(z)*(\lambda[f_b]+\mu[Ep_{err,b}]) \quad (1),$$

wherein $Q(z)$ is a discrete time filter, $\mu$ is a learning factor, $\lambda$ is a forgetting factor, and $Q(z)*[x]$ indicates that vector [x] is filtered with discrete time filter $Q(z)$. At a next burst this memorized correction term is used as a feed forward correction term, and injected in the control loop via prediction filter B(z). If no knowledge on initial transient compensation is available at a first burst (i.e. b=1) then the memory can be defined as zero (i.e. $[f_{b=1}]$ is a vector of zeros), which effectively means no transient compensation during this first burst. Notice that the length of vector $[Ep_{err,b}]$ can be equal to the number of pulses in a burst. To reduce resource claims with respect to memory and computational power of the computer system at which the learning algorithm is implemented, preferably a maximum is imposed to the length of vector $[Ep_{err,b}]$. When a burst contains more pulses than this maximum, then the last r samples of correction term $[f_b]$ are linearly forced to zero. This mechanism prevents the injection of a step-wise disturbance in the controlled system at the end of vector $[f_b]$, which would negatively impact the (dose) performance of the lithographic apparatus. In a particular embodiment, the maximum length of vector $[Ep_{err,b}]$ has been varied between 50 and 1000 pulses, and r between 10 and 100. The performance of the learning algorithm is not very sensitive for these parameters, as long as the maximum length of vector $[Ep_{err,b}]$–r includes the transient behavior of the radiation source. For current laser systems, a maximum length of 300 with r equal to 50 is acceptable.

Learning and forgetting factors ($\mu$ and $\lambda$ respectively) can be tuned as convenient. Forgetting factor $\lambda$ can be chosen smaller than unity to account for changing properties of radiation source transients. For example, to actively forget a part of the transient behavior (that should predictively corrected for) that has become irrelevant. Learning factor $\mu$ is a weight factor of new information contained in $[Ep_{err,b}]$ compared to the existing information in $[f_b]$. By choosing $\mu$ smaller than unity, the learning algorithm does not react heavily on broad band noise present in the error signal $[Ep_{err,b}]$, but on the other hand obtains a lower learning speed. Note that in standard ILC applications, the learning algorithm (or the update rule) is switched off when a sufficient correction of the repetitive disturbance is learned. This is not suitable for radiation source transient compensation, as the transient behavior varies e.g. over time and/or with a change in operational parameters. This latter aspect has resulted in the introduction of tuning parameters like learning and forgetting factors. In a particular embodiment of the feed forward controller, parameter values $\lambda=0.85$ and $\mu=0.5$ are used.

Robustness filter $Q(z)$ ensures convergence of the learning algorithm despite parasitic dynamics that may be present in the radiation source. Designing the filter $Q(z)$ normalized to the Nyquist frequency makes the learning feed forward correction method repetition rate independent. Attention is paid to the phase behavior of robustness filter $Q(z)$. As phase introduced by such a filtering action can ruin timing aspects of the correction term, zero phase filtering or a filter that has a linear phase behavior is applied. The application of such techniques is possible due to the fact that the next correction term $[f_{b+1}]$ is calculated within a burst pause. In a particular embodiment, the robustness filter $Q(z)$ is a second order low pass filter with a cut-off frequency of 0.25 times the repetition rate. With such a filter, forward and reverse digital filtering is executed such that the result has precisely zero phase distortion and a magnitude modified by the square of the filter's magnitude response (i.e. effectively fourth order filtering). Special attention is also paid to the initial condition of the filter, such that filter-transient-effects do not have a negative impact on the information content at the start of correction vector $[f_{b+1}]$. Note that there is a certain dependency between robustness filter Q(z), learning factor μ and forgetting factor λ.

The realization of prediction filter B(z) depends directly on the structural dynamics of the radiation source and the minimum order control design (such that dead beat control is effectuated). According to standard ILC design, filter B(z) is ideally designed as the inverse of the process sensitivity, which is z(z/(z−1)) for the radiation source. Since one part of this filter is identical to the summator, it can be further simplified to B(z)=z while injecting the correction term before controller 12 (which is the summator z/(z−1)). Note that with a trivial change of prediction filter B(z), the correction can also be injected after controller 12 in FIG. 4, which is then in accordance with the injection point of feed forward term $Ep_{corr}$ in FIG. 3. In general one has to design an approximation of the ideal prediction filter due to e.g. non-minimum phase behavior. However, due to the found minimum order model and accompanying control design with respect to the radiation source, the (ideal) prediction filter simplifies to a one step ahead prediction. This one step ahead prediction of the correction term is easily implemented, as the correction term $[f_{b+1}]$ is calculated in a burst pause, and completely available at the start of a next burst.

The above proposed learning feed forward correction algorithm can be regarded as a real-time method and does not introduce a measurable negative impact on the performance of the (dead beat) controlled laser system, provided that no transient and/or parasitic effects are present.

Figure 5:
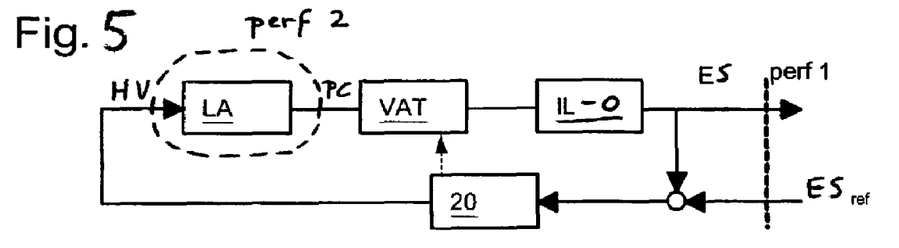
FIG. 5 depicts a control system for the radiation source of a second embodiment of the invention.

A second embodiment of the invention has an integrated control system as shown in FIG. 5. This control system uses a controller 20 to provide a closed loop feedback control based on the pulse energy as measured by the energy sensor ES. Controller 20 operates a control strategy incorporating an algorithm to calculate the target energy per pulse to deliver the desired dose at substrate level and to compensate for errors in previous pulse energies in subsequent pulses as well as an algorithm to calculate the excitation voltage HV that must be applied to the laser cavity LC to deliver a pulse of required energy. The control algorithm may also incorporate feed-forward algorithms to compensate for disturbance effects in the laser and predicted and other effects, e.g. due to lens heating, occurring downstream of the energy sensor ES. The controller 20 may also control the variable attenuator VAT. The variable attenuator VAT can be used when the required amplitude variation of Ep is large enough to cause the laser to operate outside its operational Ep range for a sustained period of time. Also, the variable attenuator VAT can be used to effect relatively low frequency variations while the high voltage HV can be used to effect relatively high frequency variations.

Figure 6:
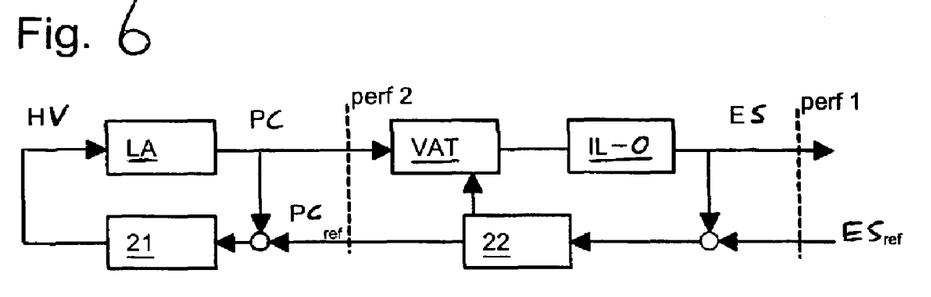
FIG. 6 depicts a control system of a third embodiment of the invention.

A third embodiment of the invention includes two controllers 21, 22 forming inner and outer control loops. The inner control loop comprises laser cavity LC, photocell PC and inner controller 21. It performs feedback control to output pulses having an energy, as measured by the photocell PC, equal to a setpoint $PC_{ref}$ supplied by the outer control loop, consisting of variable attenuator VAT, illumination optics IL-O, energy sensor ES and outer controller 22. As in the second embodiment, the control algorithm may also incorporate feed-forward algorithms to compensate for disturbance effects in the laser and predicted and other effects, e.g. due to lens heating, occurring downstream of the energy sensor ES. The outer control loop is also a feedback loop, following an externally provided setpoint $ES_{ref}$ representing the average energy per pulse required to deliver the desired dose at substrate level. The advantage of this arrangement is that the inner and outer control loops can be designed, tested and calibrated separately and the outer control loop can be used for different sources.

To measure the performance of the control loops of the invention, and/or (energy) controlled radiation systems in general, moving average and moving standard deviation performance measures are defined, as set out below, using certain parameters, as follows:

$V_{scan}$=scan speed [mm/s];
$W_{slit-e}$=effective illumination field-width [mm];
$W_{slit-t}$=total illumination field-width [mm];
$L_{die}$=length of target portion [mm];
$W_{die}$=width of target portion [mm];
RR=laser repetition rate [Hz].

The desired intensity in the slit has an approximately trapezoidal cross-section. $W_{slit-e}$ is the width at half the plateau intensity while $W_{slit-t}$ is the width at the bottom of the trapezoid.

Then the number of pulses in the effective slit, $N_{slit-e}$, is (disregarding effects of pulse quantization):

$$N_{slit-e} = \text{FLOOR}\left(\frac{W_{slit-e}}{V_{scan}} \cdot RR\right). \tag{2}$$

Similarly, the number of pulses in the total slit, $N_{slit-t}$, is:

$$N_{slit-t} = \text{FLOOR}\left(\frac{W_{slit-t}}{V_{scan}} \cdot RR\right). \tag{3}$$

The operator FLOOR rounds the operand down (towards zero) to the closest integer.

The number of pulses in a die-scan $N_{scan}$ is:

$$N_{scan} = \text{FLOOR}\left(\frac{L_{die} + W_{slit-t}}{V_{scan}} \cdot RR\right). \tag{4}$$

Note that the total length of a scan is given by:

$$L_{scan} = L_{die} + W_{slit-t} \tag{5}$$

The substrate displacement per pulse δ in [mm] is:

$$\delta = \frac{V_{scan}}{RR}. \tag{6}$$

A discrete time vector can be coupled to a discrete position vector as follows:

$$T = \left[t_0 : \frac{1}{RR} : t_0 + \frac{N_{scan}}{RR}\right]; \quad t_k = t_0 + \frac{k}{RR} \quad (k = 0 \ldots N_{scan}) \tag{7}$$
$$X = [x_0 : \delta : L_{scan}]; \quad x_k = x_0 + k \cdot \delta \quad (k = 0 \ldots N_{scan})$$

using the notation for a vector: [start$_{value}$: increment$_{value}$: end$_{value}$], where the numeric difference between two successive elements of the vector is defined as increment$_{value}$. In this way, pulse number k in an exposure indicates a certain time instance $t_k$ of the exposure, and a certain position $X_k$ on the target portion. Strictly, $X_k$ combined with a certain substrate displacement per pulse δ and target portion-width $W_{die}$ is coupled to a certain position area $A_k$ in [mm²] on the target portion:

$$A_k = W_{die} \cdot ((x_0 + k \cdot \delta) - (x_0 + (k-1) \cdot \delta)) = W_{die} \delta (k=1 \ldots N_{scan}) \quad (8)$$

which has a constant size.

The instance k=0 is the last time-instance or position just before a scan, where no pulse is fired. This is consistent with the definition of area $A_k$, which is not defined for $A_0$ (see above formulas).

The instance k=$N_{slit-t}$ is the moment that a first area on the target portion has received a complete dose. This means that areas $A_1$–$A_{(Nslit-t-1)}$ do not receive a complete dose and therefore part of the target portion is blocked by reticle masking blades, which open the illumination field at the beginning of an exposure.

The instance k=$N_{scan}$–($N_{slit-t}$–1) is the last moment that the corresponding area on the target portion receives a complete dose. In other words, it is the last moment that a pulse over the complete slit-width is given. From pulse $N_{scan}$–($N_{slit-t}$–1)+1 the reticle masking blades are gradually closing (i.e. closing the illumination field).

The instance k=$N_{scan}$ is the last pulse of an exposure of a target portion. After this moment the reticle masking blades are fully closed.

A dose $D(x_k)$ received by the resist at position $x_k$ on a target portion is approximated by a summation of pulse energies Ep(i):

$$D(x_k) = \sum_{i=k-(N_{slit-e}-1)}^{k} Ep(i) \quad (k = N_{slit-e} \ldots N_{scan}). \quad (9)$$

Thus a dose error $D_E(x_k)$ in [mJ] at position $x_k$ is given by:

$$D_E(x_k) = \sum_{i=k-(N_{slit-e}-1)}^{k} (Ep(i) - Ep_{ref}(i)) \quad (10)$$

$$= \sum_{i=k-(N_{slit-e}-1)}^{k} Ep_{err}(i) \quad (k = N_{slit-e} \ldots N_{scan}).$$

This $D_E(x_k)$ is closely related to a Moving Average (MA) of the energy error per pulse in a slit:

$$MA_E(x_k) \equiv \frac{1}{N_{slit-e}} \cdot \sum_{i=k-(N_{slit-e}-1)}^{k} Ep_{err}(i) = \frac{1}{N_{slit-e}} \cdot D_E(x_k). \quad (11)$$

In order to find a normalized indicator for the dose error, $D_E(x_k)$ is divided by the required dose. This results in a normalized version of the above $MA_E(x_k)$:

$$MA_{E,n}(x_k) = \frac{1}{\sum_{i=k-(N_{slit-e}-1)}^{k} Ep_{ref}(i)} \cdot \sum_{i=k-(N_{slit-e}-1)}^{k} Ep_{err}(i) \quad (k = N_{slit-e} \ldots N_{scan}), \quad (12)$$

wherein $Ep_{ref}(i)$ and $Ep_{err}(i)$ indicate reference energy per pulse and energy error per pulse for point i. This normalized MA of energy errors per pulse $MA_{E,n}(x_k)$ as given in equation (12), is an indicator for the relative dose error at target portion-position $x_k$. The value of this indicator can be expressed in a percentage, for example 0–5%.

In addition to a dose error, the pulse energy error may have high frequency variations during an exposure. This effect is characterized by a MSD, which equals the standard deviation of the energy pulse error relative to the MA error in [mJ]:

$$MSD_E(x_k) = \sqrt{\frac{1}{N_{slit-e}-1} \sum_{i=k-(N_{slit-e}-1)}^{k} [Ep_{err}(i) - MA_E(x_k)]^2} \quad (13)$$

$$(k = N_{slit-e} \ldots N_{scan}).$$

A normalized version of this indicator, which does not depend on the absolute value of the required energy per pulse $Ep_{ref}$, is given by:

$$MSD_{E,n}(x_k) = \sqrt{\frac{1}{N_{slit-e}-1} \sum_{i=k-(N_{slit-e}-1)}^{k} \left[\frac{Ep_{err}(i)}{Ep_{ref}(i)} - MA_{E,n}(x_k)\right]^2} \quad (14)$$

$$(k = N_{slit-e} \ldots N_{scan}).$$

Also this indicator can be expressed in a percentage, for example 0~100%.

For k=0, the MA and MSD figures are not defined, as no pulse has been fired. This is consistent with the fact that area $A_0$ is also not defined.

For k=[1 . . . ($N_{slit-e}$–1)], as no area on the target portion has received a full dose, it is defined that the MA and MSD figures are equal to zero: $MA_{E,n}(x_k) \equiv 0$ and $MSD_{E,n}(x_k) \equiv 0$.

As discussed above, the intensity in the slit has an approximately trapezoidal cross-section. Such a trapezoidal shape, or any other shape, can be incorporated in the performance indicators of e.g. equations (12) and (14) by summation over the total number of pulses in the slit $N_{slit-t}$ and applying an appropriate weight factor to each pulse. Calculating $MA_{E,n}(x_k)$ with the above refinement will result in a performance indicator that has an even closer resemblance with the actual dose error at the substrate.

For a particular apparatus, a series of test runs with the laser at different settings (pulse energy, repetition rate, etc.) are performed. During the test runs, the pulse energy is measured with the energy sensor ES and at substrate level with the spot sensor SS. The MA and MSD indicators are calculated from the energy sensor data and separately from the spot sensor data. This enables determining the relationship between MA and MSD results measured at the energy sensor and MA and MSD results at substrate level. Then, calculating MA and MSD values from the energy sensor output during an exposure provides an online performance measure.

The usefulness of these indicators is demonstrated in FIGS. 7 to 18, as discussed below.

Figure 7:
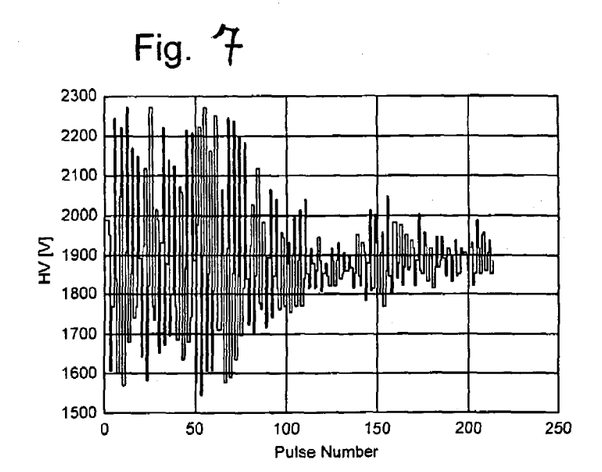
FIGS. 7 to 18 are graphs demonstrating the performance measures of the invention.
Figure 8:
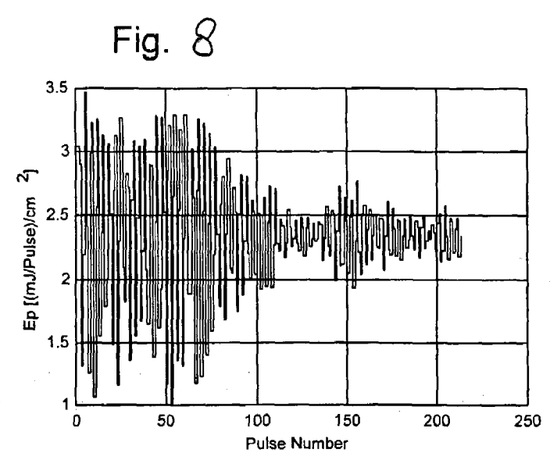
Figure 9:
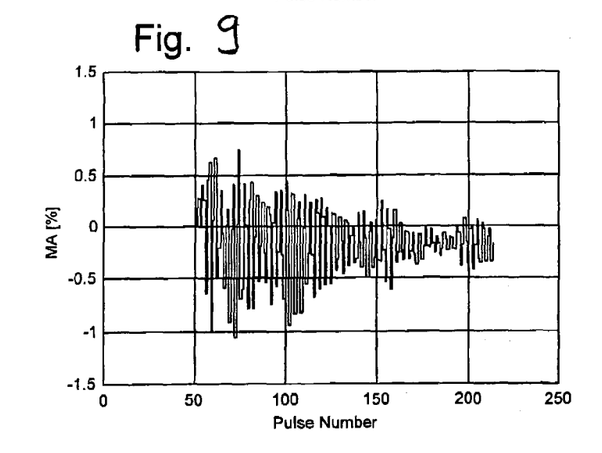
Figure 10:
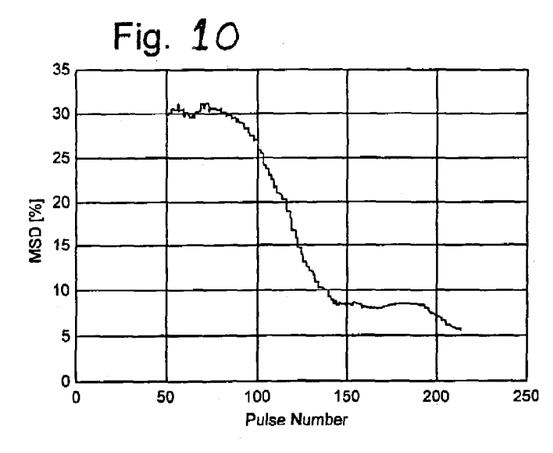
Figure 11:
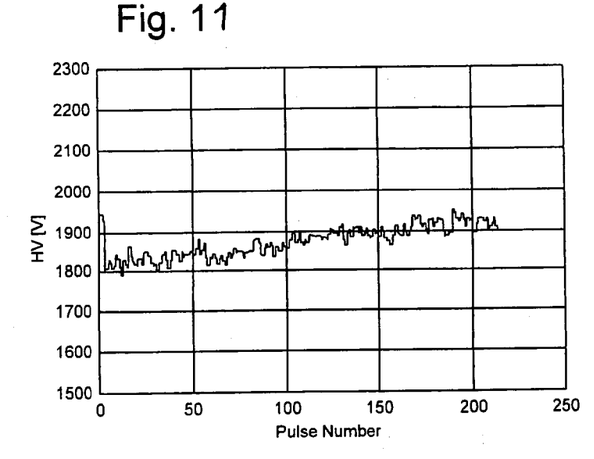
Figure 12:
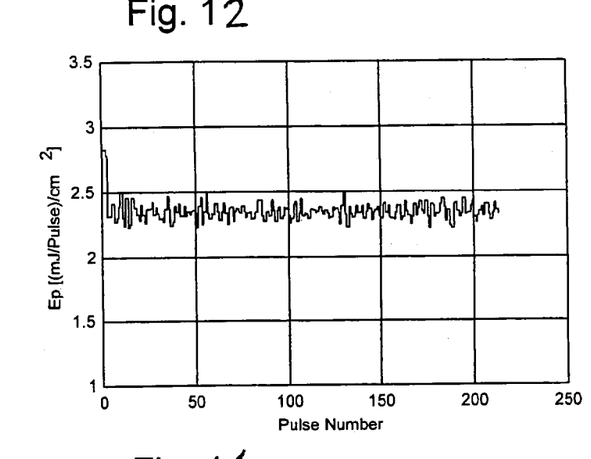
Figure 13:
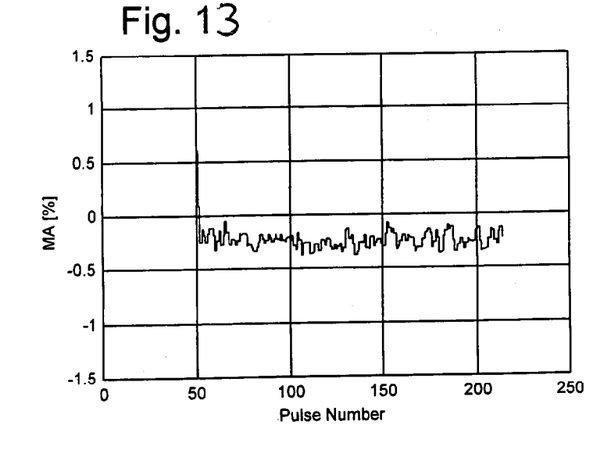
Figure 14:
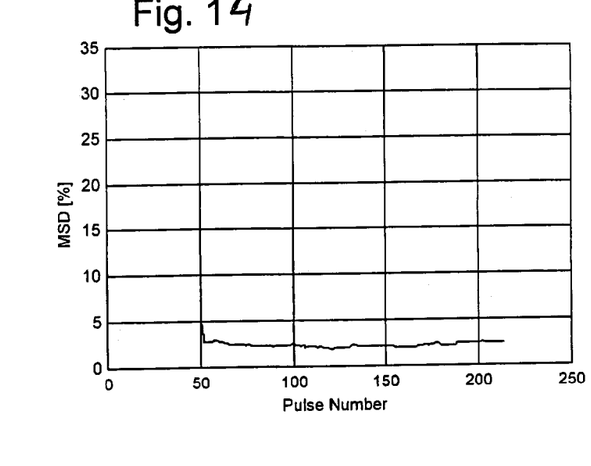
Figure 15:
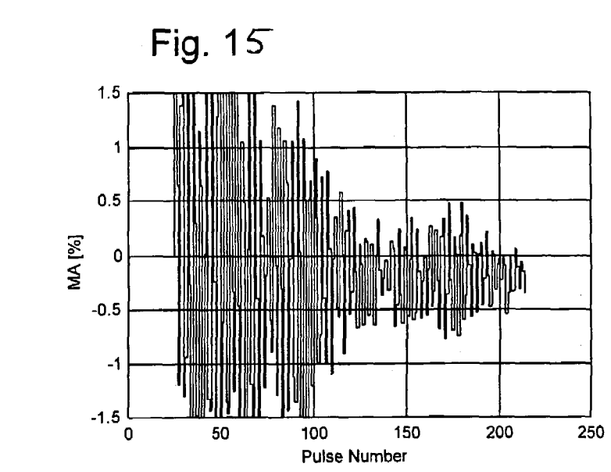
Figure 16:
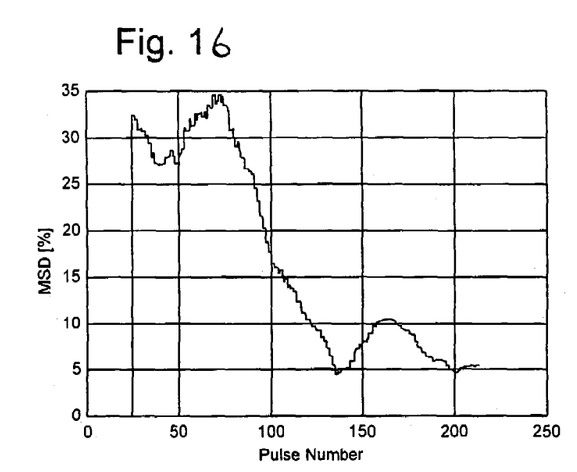
Figure 17:
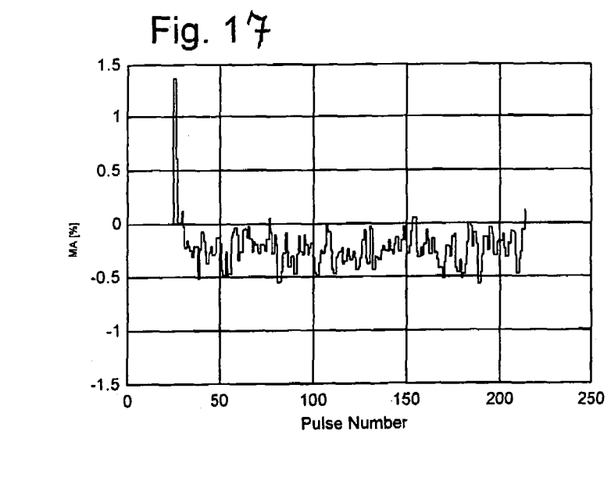
Figure 18:
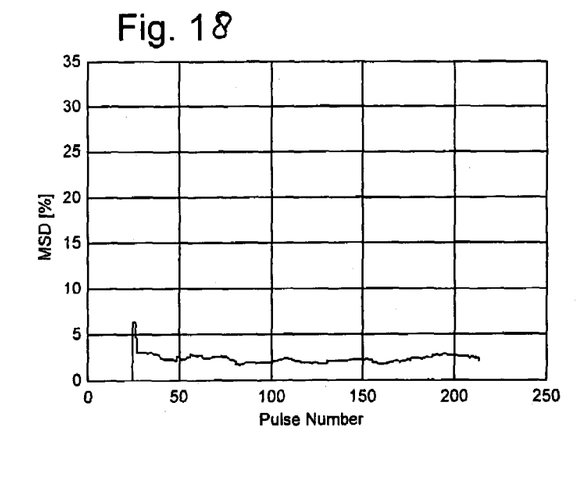

FIGS. 7 and 8 show the raw high voltage HV and pulse energy Ep data from a test of dose accuracy and repeatability of a lithographic apparatus while FIGS. 9 and 10 show the MA and MSD values, calculated as described above, with $Ep_{ref}$=2.35 (mJ/Pulse)/cm$^2$ and $N_{slit-e}$=50. The test involves performing a series of test exposures with different dose settings using the spot sensor in place of a substrate. The apparatus in question would pass the conventional test because the total dose delivered at the middle of the target portion is well within a limit of 1%, for example. Nevertheless, the large pulse to pulse variations indicate that the controlled system is close to the edge of stability, though improving during the test. This is quantified by the MA values, which also show large pulse to pulse variations, and the MSD values which are high at the beginning of the test and fall as the stability of the system improves. Some MA values are close to or higher than the acceptable performance limit at the beginning of the scan.

The results of a second set of tests, carried out after re-calibration of the apparatus, are shown in FIGS. 11 to 14, which correspond to FIGS. 7 to 10 respectively. After re-calibration, the results in the conventional test are very similar but it can be seen that the raw HV and Ep data varies much less than in the first test, indicating a much more stable control system, further reflected in the smaller variations in the MA values and the much smaller magnitude of the MSD values.

As mentioned, the conventional test does not discriminate between the apparatus before re-calibration, which is on the edge of stability, and the apparatus after re-calibration which is much more stable. The first apparatus, though operating within the limits specified in the conventional test, is vulnerable to a change in conditions, such as a change in the response of the laser or a reduction in the number of pulses in the slit width, which may drive its performance out of limits. This can be shown with the MA and MSD indicators of the invention. FIGS. 15 to 18 show the MA and MSD values from the first and second tests described above but recalculated with a number of pulses in the slit $N_{slit}$, of 23 rather than 50. It can be seen that the MA values recalculated from the first test results, shown in FIG. 15, increase significantly while those from the second test, shown in FIG. 17, remain relatively small. Similarly, the recalculated MSD values for the first test, shown in FIG. 16, have a higher peak and show greater variability while those from the second test, shown in FIG. 17, remain low and relatively constant.

It will be appreciated from the above that while the full MA and MSD give a more complete picture of the performance of the apparatus, the peak values of each also give a good indication of the performance of the apparatus.

The above described performance indicators, allow fine tuning of a control system so as to provide dead beat control, i.e. a critically damped system with no over-run or oscillation in changing from state to state. Where the response of the laser is a simple time delay $z^{-1}$ independent of the repetition rate at which the laser fires pulses, the control system can be implemented as a summator $z/(z-1)$, the parameters of which can be adjusted with reference to the MA and MSD performance indicators.

Interpretation of the MA performance indicator in the frequency domain provides an alternative way of determining a specification for the performance and calibration of the radiation source, e.g. how accurate needs dead beat control be approximated, or what type of varying pulse energy reference signals can be considered meaningful. For example, the specification for the calibration can be translated into a specification for the required HV-Ep calibration accuracy. The usage of the frequency domain interpretation of the MA performance indicator affects the complete design for the control and use of the laser system, and is much broader than an accuracy specification of the HV-Ep calibration alone.

All the methods described in the present invention remain fully functional when a varying reference $Ep_{ref}$ for the energy per pulse is applied.

Based on a control system comprising a closed-loop controller of first order, two different methods to determine the pulse-energy/high-voltage gain and accompanying offset values (the HV-Ep calibration) are implemented. The two methods are distinguished by the fact that the first method comprises the step of using test runs (denoted by off-line HV-Ep calibration), while in the second method an HV-Ep calibration is performed with the data acquired during an actual exposure (i.e. during production, denoted by on-line HV-Ep calibration).

The off-line HV-Ep calibration provides a sinusoid signal to be imposed on the reference energy per pulse (or injects a sinusoid at another point in the control loop) and monitors specific signal(s) in the controlled system. Then, from the relation between the imposed sinusoid signal and the monitored (intermediate) signal(s), in combination with the current controller and HV-Ep calibration settings, new HV-Ep calibration parameters (gain and offset values) are calculated. The imposed sinusoid signal is tuned with respect to frequency, amplitude and number of periods. This newly proposed off-line HV-Ep calibration scheme provides an advantage over current HV-Ep calibration methods in that it requires less time and pulses for a calibration with the same accuracy.

The on-line HV-Ep calibration aims at utilizing the information already contained in pulse-to-pulse data of the controlled radiation source in a lithographic apparatus. Information is already contained in the pulse-to-pulse data due to the peak-to-peak variation that occurs on the energy per pulse of every radiation source. HV-Ep calibration parameters can be obtained from pulse-to-pulse data (acquired from specific signals in the controlled system during normal exposure) in combination with structural knowledge of the minimum order controlled system, for example by applying prediction error techniques. To further improve the accuracy of an HV-Ep calibration, a preselected signal, for example a high frequency sinusoid, can be injected in the controlled system such as to endow the data with additional information on the controlled system. This to be injected signal is designed such that it does not affect dose control performance. The design of such a signal is guided by the performance measures as defined above.

While specific embodiments of the invention have been described above, it will be appreciated that the invention may be practiced otherwise than as described. The description is not intended to limit the invention.

What is claimed is:

1. A lithographic projection apparatus, comprising:
   a radiation system constructed and arranged to provide a beam of radiation, including a pulsed radiation source;

a support constructed and arranged to support a patterning device, the patterning device constructed and arranged to pattern the projection beam according to a desired pattern;

a substrate table constructed and arranged to hold a substrate;

a projection system constructed and arranged to project the patterned beam onto a target portion of the substrate; and a control system constructed and arranged to control the energy of pulses of the beam of radiation, wherein the control system comprises a closed-loop controller of minimum order and the control system further comprises a feed forward controller to provide corrections to compensate for transient effects arising from changes in conditions.

2. An apparatus according to claim 1, wherein the closed-loop controller is of first order.

3. An apparatus according to claim 1, wherein the closed-loop controller comprises an amplifier and a first order integrator.

4. An apparatus according to claim 1, wherein the control system effects dead beat control, or a close approximation thereof.

5. An apparatus according to claim 1, wherein the control system is independent of a repetition rate of the pulsed radiation source.

6. A method of measuring the performance of a pulsed radiation source or lithographic projection apparatus, the lithographic projection apparatus comprising:

a radiation system constructed and arranged to provide a beam of radiation, including the pulsed radiation source;

a support constructed and arranged to support a patterning device, the patterning device constructed and arranged to pattern the beam of radiation according to a desired pattern;

a substrate table constructed and arranged to hold a substrate;

a projection system constructed and arranged to project the patterned beam of radiation onto a target portion of the substrate, the method comprising:

measuring, for a plurality of consecutive pulses of radiation, the values of at least one of a pulse energy and a control input applied to the pulsed radiation source;

calculating from the measured values a plurality of values of at least one of a moving average error between the measured value and a target value and a moving standard deviation of the error between the measured value and a target value wherein the calculated values indicate the performance of the pulsed radiation source or the lithographic projection apparatus; and controlling the energy of pulses of the beam of radiation using a closed-loop controller a minimum order and a feed forward controller to provide corrections to compensate for transient effects arising from changes in conditions.

7. A method according to claim 6, wherein the calculating includes normalizing the calculated values.

8. A method according to claim 6, wherein the pulsed radiation source is an excimer laser and the control input is an excitation voltage applied to a lasing medium of the excimer laser.

9. A method according to claim 6, wherein the measuring of the pulse energy is carried out using an energy sensor provided in the radiation system.

10. A computer program comprising program codes that, when executed on a computer system controlling a lithographic projection apparatus, instructs the computer system to perform the method of claim 6.

11. A method of calibrating a control system of a pulsed radiation source in a lithographic apparatus, the lithographic apparatus comprising:

a radiation system constructed and arranged to provide a beam of radiation, including the pulsed radiation source;

a support constructed and arranged to support a patterning device, the patterning device constructed and arranged to pattern the beam of radiation according to a desired pattern;

a substrate table constructed and arranged to hold a substrate;

a projection system constructed and arranged to project the patterned of radiation onto a target portion of the substrate, the method comprising:

measuring, for a plurality of consecutive pulses of radiation, the values of at least one of a pulse energy and a control input applied to the pulsed radiation source;

calculating from the measured values a plurality of values of at least one of a moving average error between the measured value and a target value and a moving standard deviation of the error between the measured value and a target value wherein the calculated values indicate the performance of the pulsed radiation source or the lithographic projection apparatus; and controlling the energy of pulses of the beam of radiation using a closed loop controller of minimum order and a feed forward controller to provide corrections to compensate for transient effects arising from changes in conditions;

adjusting at least one parameter of the control system associated with the pulsed radiation source; and repeating the measuring and adjusting to reduce at least one of the calculated moving average and moving standard deviation values.

12. A method according to claim 11 wherein at least the measuring is carried out during exposures of target portions of the substrate.

13. A method according to claim 12, further comprising:

adjusting at least one parameter of the control system associated with the pulsed radiation source.

14. A method according to claim 13, wherein the pulsed radiation source is an excimer laser and the parameter of the control system comprises the gain which models the transfer function between a high voltage applied to a laser cavity and the pulse energy.

15. A device manufacturing method, comprising:

providing a beam of radiation using a radiation system including a pulsed radiation source;

patterning the beam of radiation with a pattern in its cross-section;

projecting the patterned beam of radiation onto a target portion of the layer of radiation-sensitive material; and controlling the radiation source using a closed-loop controller of minimum order and a feed forward controller to provide corrections to compensate for transient effects arising from changes in conditions.

16. A method according to claim 15 wherein the closed-loop controller is of first order.

* * * * *